(12) United States Patent
Sugiyama

(10) Patent No.: US 7,583,349 B2
(45) Date of Patent: Sep. 1, 2009

(54) DISPLAY DEVICE

(75) Inventor: Ken Sugiyama, Kawagoe (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 12/021,145

(22) Filed: Jan. 28, 2008

(65) Prior Publication Data

US 2008/0246910 A1      Oct. 9, 2008

(30) Foreign Application Priority Data

Apr. 6, 2007    (JP)    ............... 2007-100084

(51) Int. Cl.
*G02F 1/1345* (2006.01)
(52) U.S. Cl. .................... 349/150; 349/151; 349/156; 349/149
(58) Field of Classification Search ................ 349/150
See application file for complete search history.

(56) References Cited

U.S. PATENT DOCUMENTS 6,909,053 B2 * 6/2005 Satonaka ................ 174/259
6,937,478 B2 * 8/2005 Lee et al. ................ 361/761
2002/0057235 A1 * 5/2002 Murai et al. ................ 345/84
2002/0180923 A1 * 12/2002 Aoyagi et al. ............... 349/149
2003/0067577 A1 * 4/2003 Yamada ..................... 349/150
2005/0248710 A1 * 11/2005 Hirosue et al. .............. 349/151

FOREIGN PATENT DOCUMENTS

JP       2001-133756       5/2001

* cited by examiner

*Primary Examiner*—Frank G Font
*Assistant Examiner*—Mary A El Shammaa
(74) *Attorney, Agent, or Firm*—Finnegan, Henderson, Farabow, Garrett & Dunner, L.L.P.

(57) ABSTRACT

On a projecting portion projecting from a first connecting portion to be connected to a liquid crystal panel of an FPC, a second connecting portion is provided in a projecting state like a free end to the liquid crystal panel side at a position spaced from the first connecting portion. By folding-back the projecting portion to the back side of the liquid crystal panel, the second connecting portion projects to the opposite side of the liquid crystal panel, so that the liquid crystal panel and an external circuit can be connected to each other without applying an excessively great stress to the FPC.

4 Claims, 7 Drawing Sheets

DISPLAY DEVICE

INCORPORATION BY REFERENCE

The present application claims priority under 35 U.S.C. §119 to Japanese Patent Application No. 2007-100084 filed on Apr. 6, 2007. The content of the application is incorporated herein by reference in its entirety.

FIELD OF THE INVENTION

The present invention relates to a display device including a flexible substrate which electrically connects a display element side and an external circuit side.

BACKGROUND OF THE INVENTION

Liquid display devices as display devices have been widely used across the industrial fields, and have been increasingly applied for uses in mobile terminals by utilizing their advantages such as thinness and low power consumption.

Recently, in conjunction with the spread of equipment with liquid crystal display devices, downsizing and reduction in thickness thereof have been increasingly demanded. There are flexible substrates that realize this demand.

In the recent trend of accelerating downsizing and reductions in thickness of products, as such a flexible substrate, for example, as described in Japanese Laid-Open Patent Publication No. 2001-133756, there is known a flexible substrate which is folded back from a liquid crystal panel that is a liquid crystal display element as a display element to the back side of the liquid crystal panel and fixed, for example, to a light guide plate of a backlight or a metal frame covering the liquid crystal panel.

A flexible substrate is connected between the liquid crystal panel side and an external circuit which inputs image signals, etc., into the liquid crystal panel, so that this flexible substrate must be provided with a connecting portion for connection to the external circuit.

However, in the above-described display device, the flexible substrate is fixed in a state that it is folded back to the back side of the liquid crystal panel, so that if the connecting portion is provided on the tip end side of the flexible substrate, the flexible substrate folded back must be folded back again with respect to the liquid crystal panel so as to project to the outside of the liquid crystal panel, and this applies a stress to the flexible substrate.

The present invention has been made in view of this problem, and an object thereof is to provide a display device which can connect a display element to an external circuit without applying an excessively great stress to the flexible substrate.

SUMMARY OF THE INVENTION

A display device of the present invention is provided with a display element and a flexible substrate which electrically connects the display element and an external circuit, wherein the flexible substrate includes a first connecting portion connected to the display element, a projecting portion which is formed continuously from the first connecting portion, projecting to the outside of the display element and is folded back and fixed to one principal surface side of the display element, and a second connecting portion which is provided in a projecting state like a free end from the projecting portion to the display element side at a position spaced from the first connecting portion and is connected to the external circuit side. By providing the second connecting portion in a projecting state like a free end to the display element side at a position spaced from the first connecting portion on the projecting portion projecting from the first connection portion to be connected to the display element of the flexible substrate, the second connecting portion projects to the opposite side of the display element by folding back the projecting portion to one principal surface side of the display element, so that the display element and the external circuit can be connected to each other without applying an excessively great stress to the flexible substrate.

DETAILED DESCRIPTION OF THE PREFERRED EMBODIMENT

Figure 1:
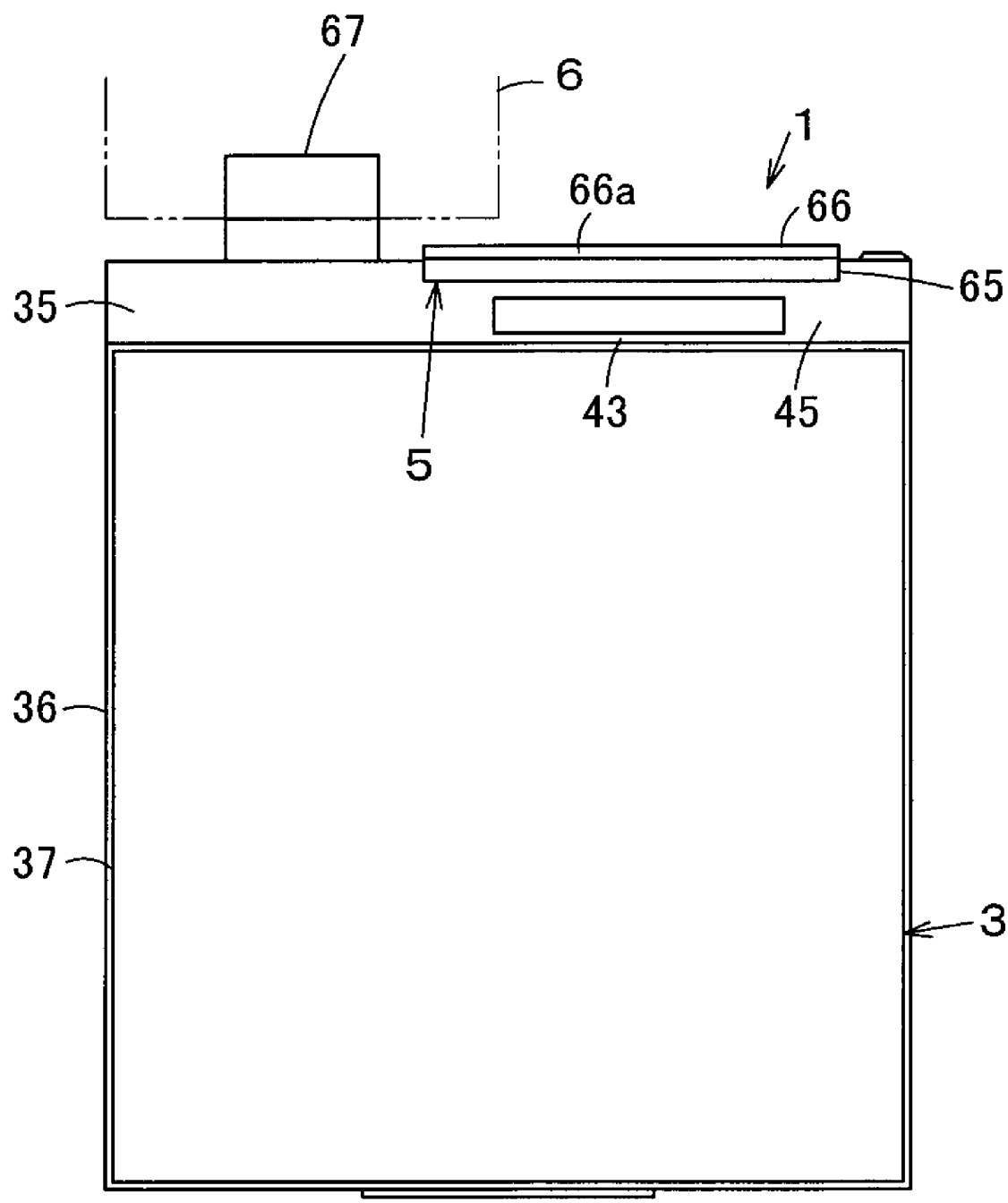
FIG. 1 is a plan view showing a surface side of a display element in a state that a flexible substrate is bent for a display device of an embodiment of the present invention.

Hereinafter, a constitution of a display device of an embodiment of the present invention will be described with reference to FIG. 1 through FIG. 7.

In FIG. 1 through FIG. 7, the reference numeral 1 denotes a liquid crystal display device that is a flat display device as a display device to be used in a mobile terminal such as a mobile phone, and this liquid crystal display device 1 is held inside a metal-made bezel 2 as a frame while a liquid crystal panel 3 that is a flat display element as a display element, that is, a liquid crystal display and a backlight 4 as a planar light source device which irradiates this liquid crystal panel 3 with planar light are superimposed with each other, and is electrically and physically connected to an external circuit 6 by a flexible printed circuit board 5 (hereinafter, referred to as FPC 5) as a flexible substrate connected to the liquid crystal panel 3.

Figure 5:
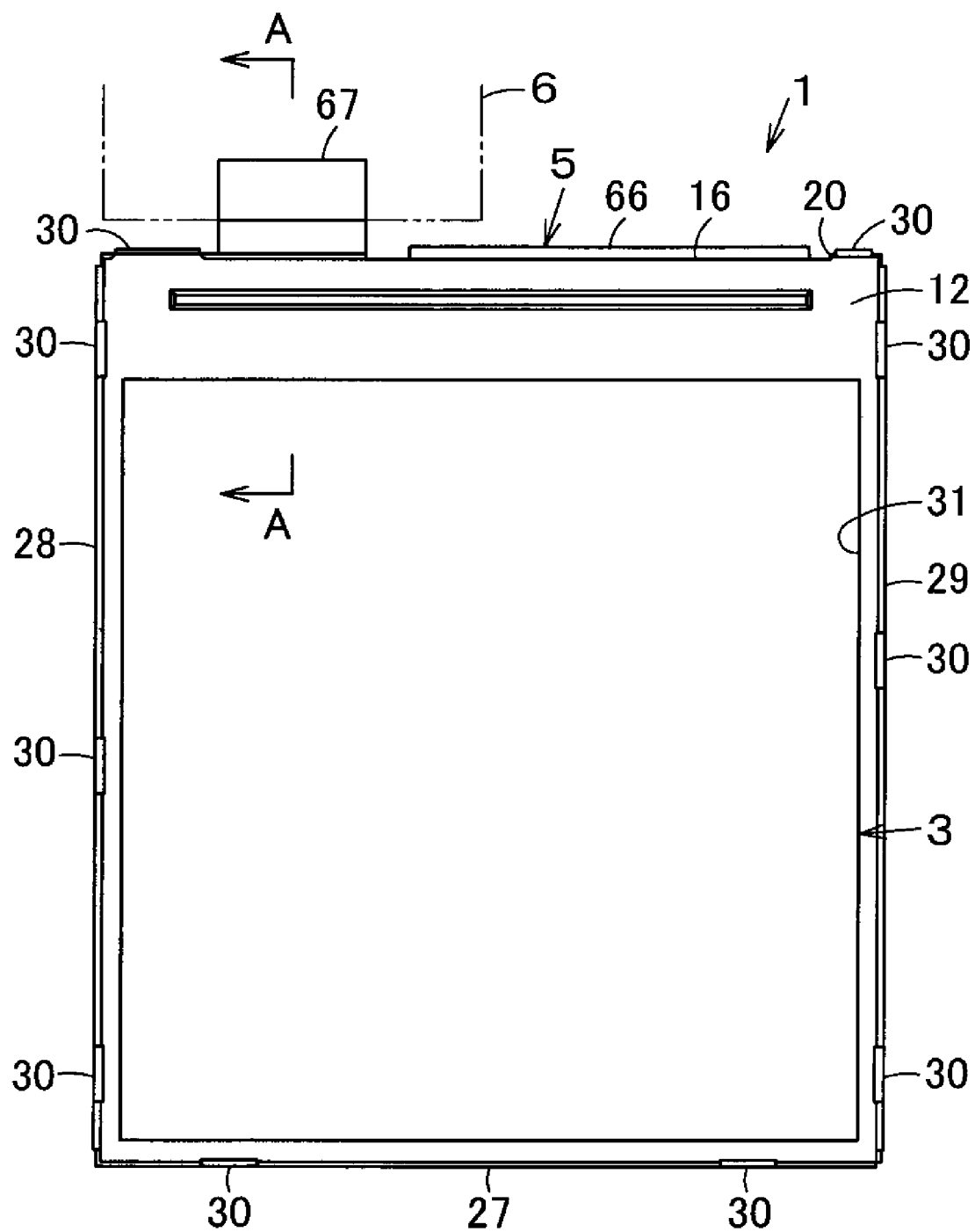
FIG. 5 is a plan view showing the surface side of the display device.
Figure 6:
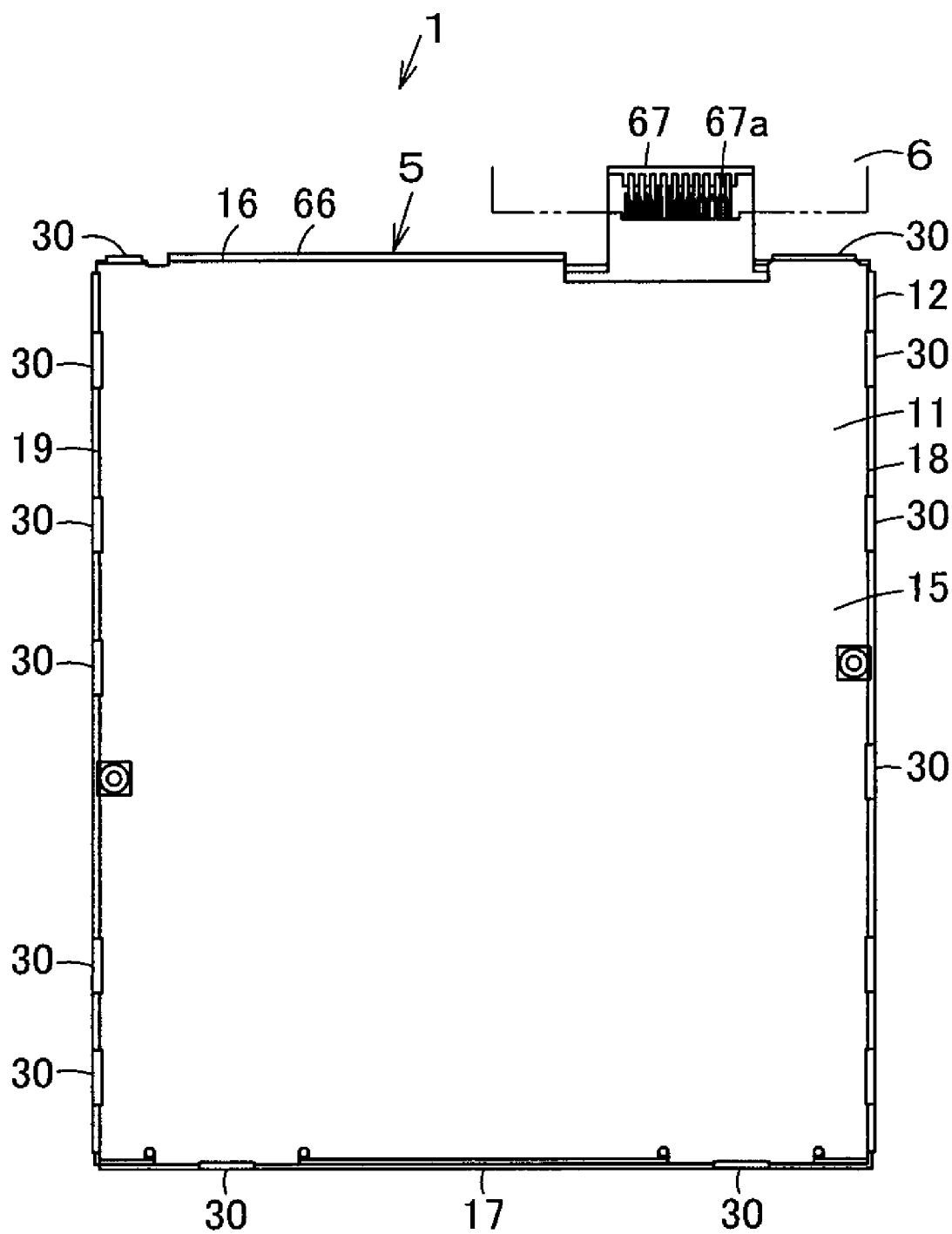
FIG. 6 is a plan view showing the back side of the display device.
Figure 7:
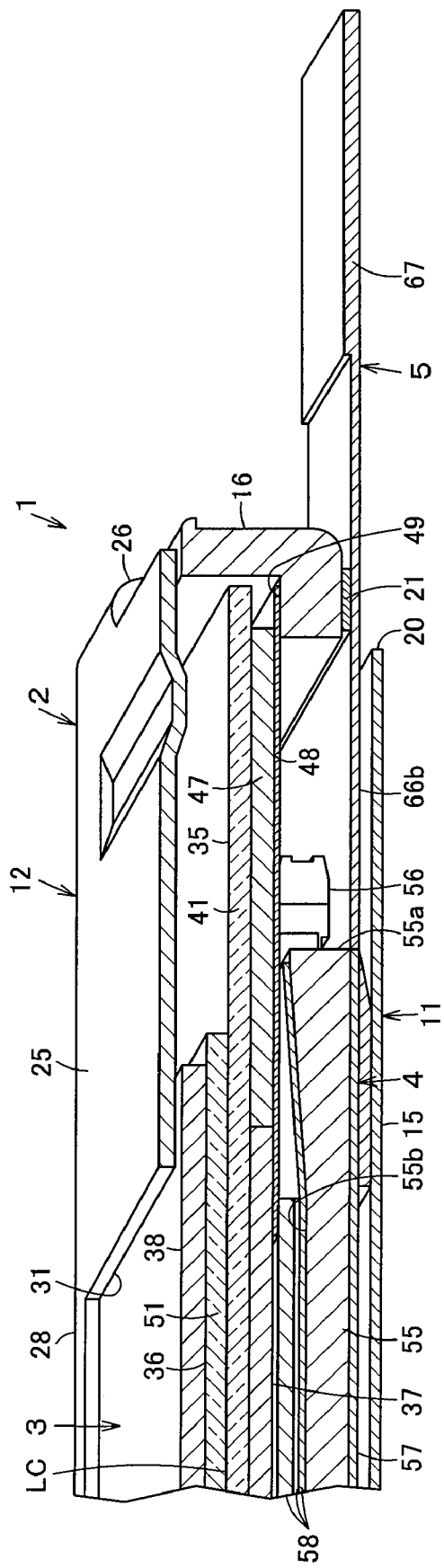
FIG. 7 is a sectional view of the display device along A-A of FIG. 5.

As shown in FIG. 5 through FIG. 7, the bezel 2 has a bezel main body 11 positioned on the backlight 4 side of the back side, and a bezel cover 12 attached to the front surface side of the bezel main body 11.

The bezel main body 11 has a bottom plate 15 in a quadrilateral shape in a plan view, end walls 16 and 17 projecting from both longitudinal ends of the bottom plate 15 to the front side, that is, to the bezel cover 12 side, and side walls 18 and 19 projecting to the front side from both widthwise ends of the bottom plate 15, and in the end wall 16, an opening 20 from which a part of the FPC 5 is exposed is opened, and to this opening 20, a tape 21 for fixing the FPC 5 is adhered.

The bezel cover 12 has a front plate 25 in a quadrilateral shape slightly larger than the bezel main body 11 in a plan view, cover end walls 26 and 27 projecting from both longitudinal ends of the front plate 25 to the rear side, that is, to the bezel main body 11 side, and cover side walls 28 and 29 projecting from both widthwise ends of the front plate 25 to the rear side, and is detachably attached to the bezel main body 11 by bezel connecting portions 30 formed between the end walls 16 and 17 and side walls 18 and 19 of the bezel main body 11. Further, in the front plate 25, an exposure opening 31 in a quadrilateral shape from which the front side of the liquid crystal panel 3 is exposed is opened. This exposure opening 31 deflects closer to the cover end wall 27 side than the cover end wall 26, and is formed across the vicinities of the cover side walls 28 and 29.

The liquid crystal panel 3 is, for example, an active matrix type, and is formed into a quadrilateral shape in a plan view and includes an array substrate 35 and a liquid crystal layer LC interposed between the array substrate 35 and a counter substrate 36 opposing the array substrate 35, and onto one principle surfaces of the array substrate 35 and the counter substrate 36, polarizing plates 37 and 38 are attached, respectively.

In the array substrate 35, on the front surface of a transparent glass substrate 41 as an insulating substrate, that is, on the opposite side of the polarizing plate 37, scanning lines and signal lines that are not shown are formed in a grid pattern, and at the respective intersections of these scanning lines and signal lines, thin-film transistors (TFTs) serving as switching elements are disposed, and in the quadrilateral area surrounded by the paired scanning lines and paired signal lines, a substantially quadrilateral pixel electrode which is electrically connected to a drain electrode of the thin film transistor and constitutes a sub-pixel is disposed. Therefore, sub-pixels are formed in a matrix on the glass substrate 41, and the area in which these sub-pixels are arranged is a quadrilateral display area which is exposed from the exposure opening 31 of the bezel 2 and displays images.

Figure 3:
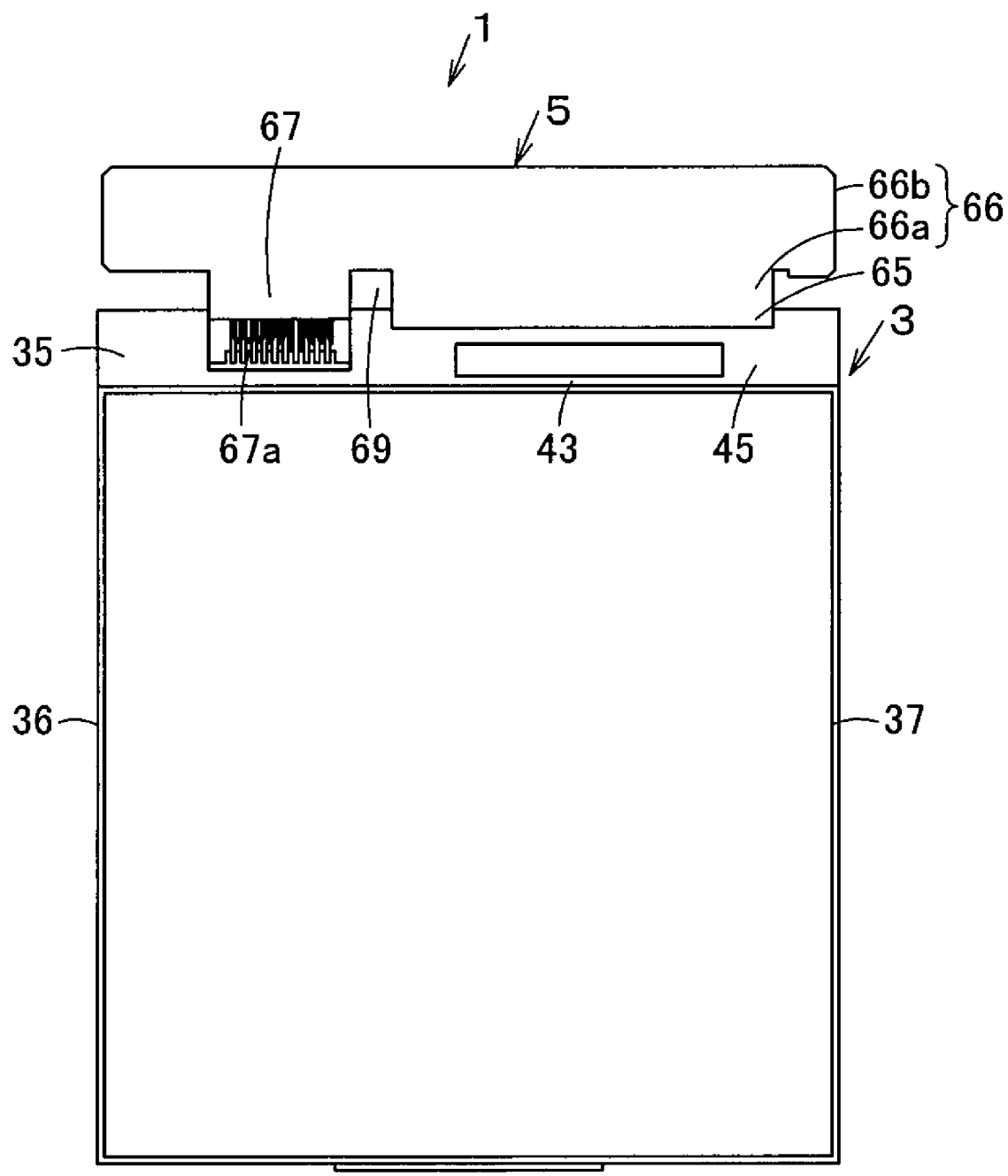
FIG. 3 is a plan view showing the surface side of the display element in a state that the flexible substrate is opened.

Further, on the glass substrate 41, at one longitudinal end side projecting from the counter substrate 36, a driver IC 43 serving as a driving means for driving the respective thin film transistors is disposed. This driver IC 43 is formed long along the longitudinal direction of the glass substrate 41, and deflects to the right side as shown in FIG. 1 and FIG. 3. The area in which the driver IC 43 is disposed of the array substrate 35 serves as an input terminal 45 to be connected to the external circuit 6 via the FPC 5.

On the back side of the glass substrate 41, that is, on the backlight 4 side, a spacer 47 with a thickness equal to that of the polarizing plate 37 is attached to the outer side of the polarizing plate 37. The liquid crystal panel 3 is attached onto the backlight 4 via connecting tapes 48 adhered across the spacer 47 and the ends of the polarizing plate 37, and its peripheral portions are fixed to stepped portions 49 formed on the inner sides of the end walls 16 and 17 and side walls 18 and 19 of the bezel 2.

In the counter substrate 36, on the back side of a transparent glass substrate 51 as an insulating substrate, that is, on the opposite side of the polarizing plate 38, a color filter as a colored layer that is not shown and a counter electrode as common electrode are laminated.

The color filter is obtained by coloring the sub-pixels with, for example, three RGB colors, and these three colors constitute one pixel.

The counter electrode is for displaying images on the sub-pixels according to a voltage applied between the counter electrode and the pixel electrode of the array substrate 35.

The backlight 4 includes a light guide plate 55 serving as a light guide in a quadrilateral plate shape smaller than the liquid crystal panel 3 in a plan view, and a plurality of LEDs 56 as light sources mounted on the FPC 5, and onto the back side as one principal surface of the light guide plate 55, that is, on the bezel main body 11 side, a reflecting film 57 is adhered, and on the front surface side as the other principal surface of the light guide plate 55, that is, the liquid crystal panel 3 side, various sheets 58 for dispersion and light condensing are superimposed.

A side surface as one end face of the light guide plate 55 serves as an entrance face 55a which lights from the LEDs 56 are made to enter, and the back surface reflects and diffuses lights from the LEDs 56 that have entered into the entrance face 55a, and converts these into planar lights and makes these exit from the exit face 55b of the front surface, and is formed to be larger than at least the display area of the liquid crystal panel 3.

A plurality of LEDs 56 are arranged in a width direction of the light guide plate 55 so as to be spaced from each other, and oppose the entrance face 55a of the light guide plate 55 inside the bezel 2.

The FPC 5 has, as shown in FIG. 1 through FIG. 4, a first connecting portion 65 to be electrically and physically connected to the input terminal 45 of the liquid crystal panel 3 by a conductive thermoplastic cement (AC) or the like, and on this first connecting portion 65, a projecting portion 66 is continuously formed, and on this projecting portion 66, a second connecting portion 67 to be electrically and physically connected to the external circuit 6 is provided in a projecting state like a free end.

The first connecting portion 65 serves as, for example, an output portion for outputting signals to the liquid crystal panel 3, and is formed to be long left-right in the drawings, corresponding to the input terminal 45 of the liquid crystal panel 3.

The projecting portion 66 has a bending portion 66a whose base end side is continued to the first connecting portion 65 and a continuous portion 66b continued to the tip end side of the bending portion 66a.

The bending portion 66a is folded back to the back side of the light guide plate 55 of the backlight 4 on the back side of the liquid crystal panel 3 when the liquid crystal panel 3 is attached inside the bezel 2, and is formed to be long left-right in the drawings, and has a longitudinal size substantially equal to that of the first connecting portion 65.

The continuous portion 66b is formed so that a length between both ends thereof is substantially equal to the width of the liquid crystal panel 3, and is continued to the bending portion 66a at a position close to one longitudinal end, and the other longitudinal end projects more than the one end in the longitudinal direction of the bending portion 66a. On the back side of the continuous portion 66b, that is, on the back side in a state that the FPC 5 is opened, the LEDs 56 and various components such as capacitors or resistors that are not shown are mounted.

The second connecting portion 67 is, for example, an input portion into which signals are inputted from the external circuit 6, and projects to the liquid crystal panel 3 side in the same manner as the first connecting portion 65 from a position spaced from the bending portion 66a on the other longitudinal end side of the continuous portion 66b of the projecting portion 66. That is, between the second connecting portion 67 and the continuous portion 66b of the projecting portion 66, a notch 69 that is a constricting portion as a space is formed into a recess with a predetermined width, and at a position extended from the first connecting portion 65, the second connecting portion 67 is not positioned. Further, on the tip end side of the second connecting portion 67, on the surface side in a state that the FPC 5 is opened, a terminal 67a for connection to the external circuit 6 is provided.

The external circuit 6 is for transmitting image signals, etc., to the driver IC 43.

Next, effects of the above-described embodiment will be described.

To assemble the liquid crystal display device 1, first, the first connecting portion 65 of the FPC 5 is connected to the array substrate 35 of the liquid crystal panel 3 via a conductive thermoplastic cement.

Figure 4:
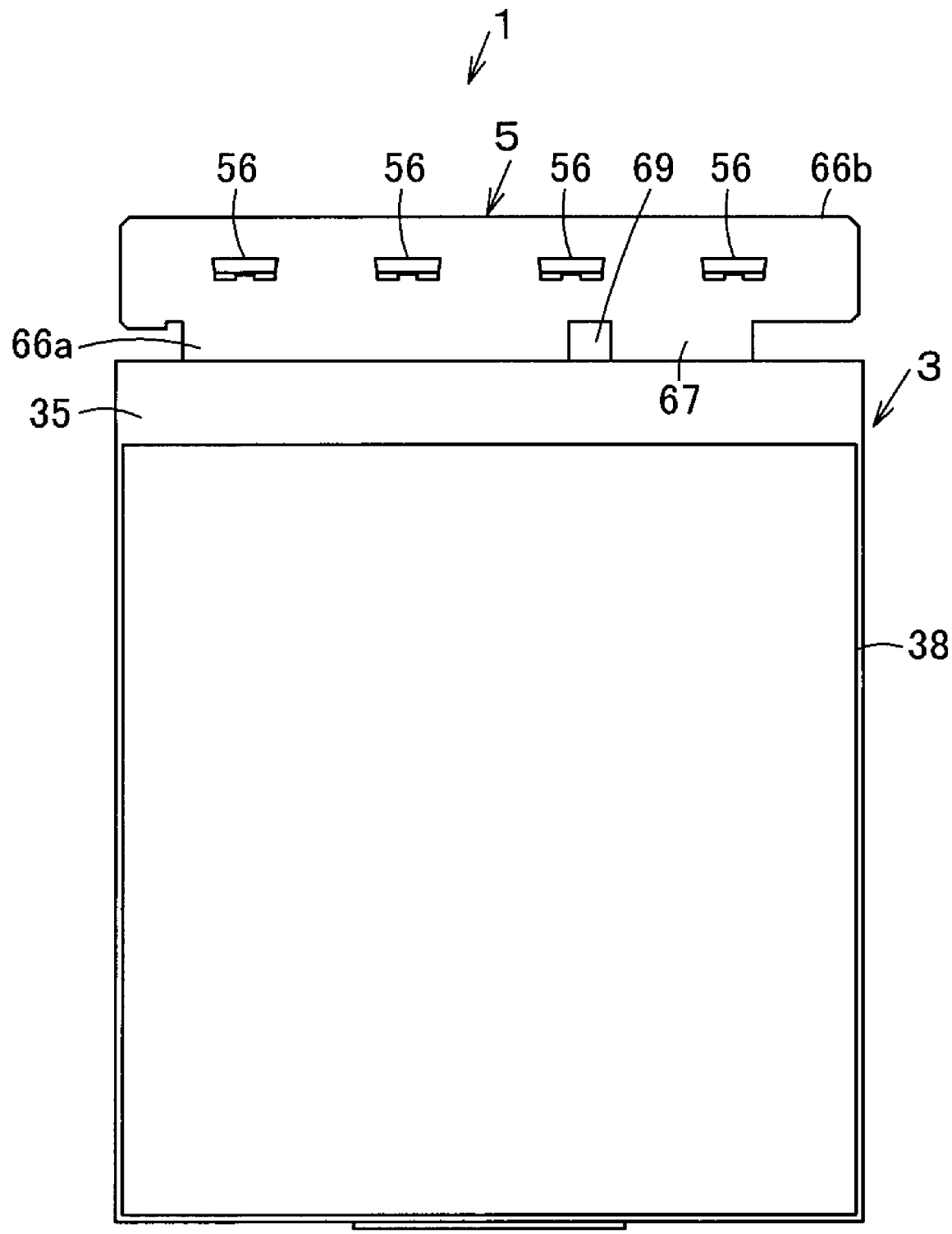
FIG. 4 is a plan view showing the back side of the display element in a state that the flexible substrate is opened.

In this state, as shown in FIG. 3 and FIG. 4, the projecting portion 66 projects outward from one longitudinal end of the liquid crystal panel 3, and the second connecting portion 67 is directed toward the liquid crystal panel 3 side and positioned so as to interfere with the surface on which the input terminal 45 of the array substrate 35 of the liquid crystal panel 3 is positioned.

Figure 2:
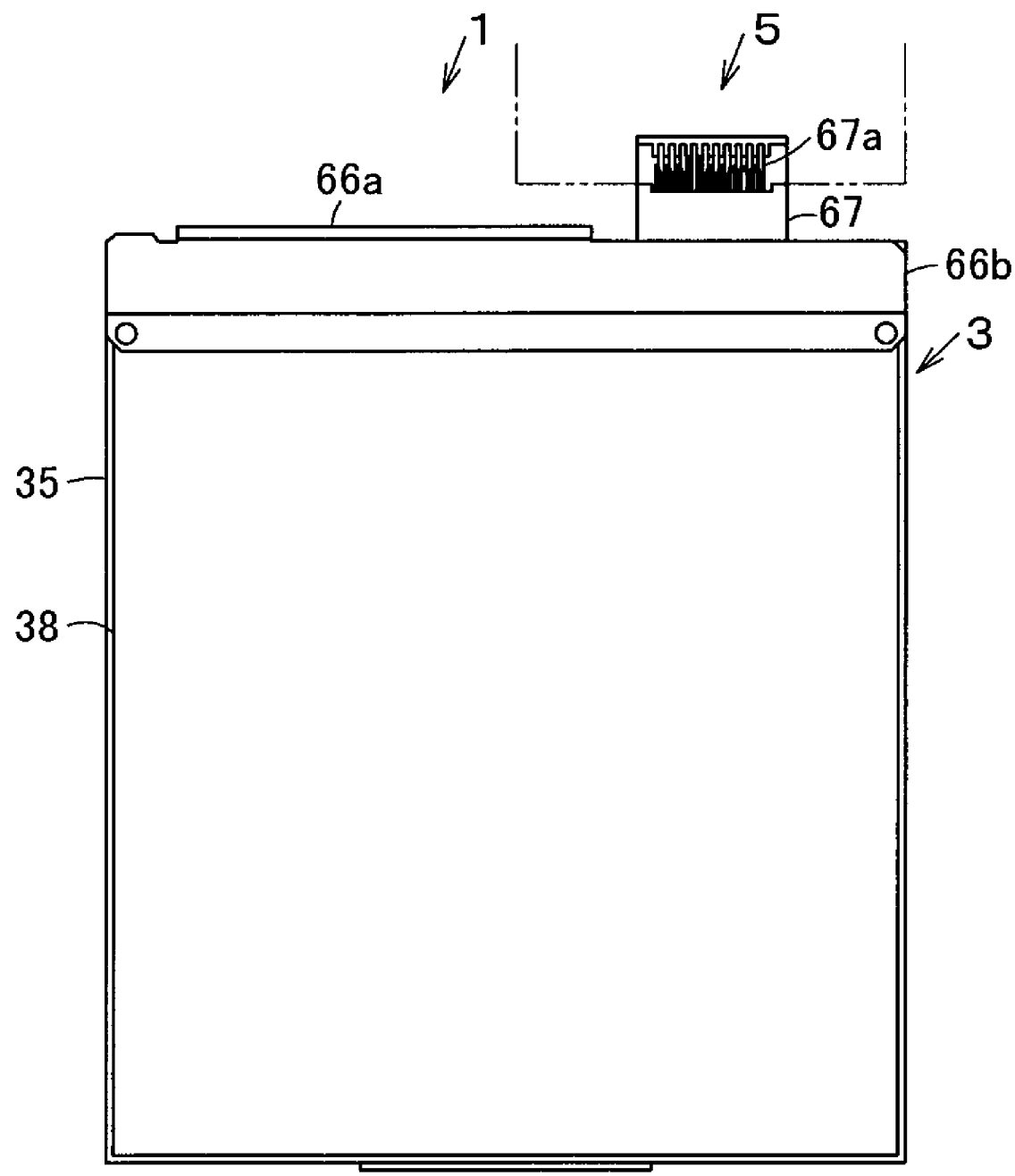
FIG. 2 is a plan view showing a back side of the display element in a state that the flexible substrate is bent.

Then, after attaching the liquid crystal panel 3 and the light guide plate 55 together via the connecting tape 48, the bending portion 66*a* of the projecting portion 66 of the FPC 5 is folded back by 180 degrees toward the light guide plate 55 on the back side of the liquid crystal panel 3, whereby, as shown in FIG. 1 and FIG. 2, the second connecting portion 67 projects oppositely to the first connecting portion 65, and as shown in FIG. 7, the LEDs 56 oppose the entrance face 55*a* of the light guide plate 55, and various components mounted on the projecting portion 66 are sealed among the FPC 5, the liquid crystal panel 3 and light guide plate 55.

In this state, the FPC 5 is adhered and fixed onto the reflecting film of the light guide plate 55, and placed on the bottom plate 15 of the bezel main body 11. At this time, the outer surface side of the bending portion 66*a* of the projecting portion 66 of the FPC 5 is exposed to the outside of the bezel 2 from the opening 20, and the second connecting portion 67 projects from the bezel 2.

Then, the bezel cover 12 is covered on the front side of the bezel main body 11, and by the respective bezel connecting portions 30, the bezel main body 11 and the bezel cover 12 are fixed, whereby the liquid crystal display device 1 shown in FIG. 5 and FIG. 6 is completed.

Thereafter, the second connecting portion 67 projecting from the bezel 2 is connected to the external circuit 6.

As described above, in the above-described embodiment, on the projecting portion 66 projecting from the first connecting portion 65 of the FPC 5, the second connecting portion 67 is provided in a projecting state like a free end to the liquid crystal panel 3 side at a position spaced from the first connecting portion 65, and the projecting portion 66 is folded back to the back side of the liquid crystal panel 3, whereby the second connecting portion 67 projects oppositely to the liquid crystal panel 3 and the terminal 67*a* is positioned on the back side.

That is, in the liquid crystal display device 1, for reduction in thickness and space saving, the constitution in which the FPC 5 is folded back by 180 degrees is generally employed, and in this conventional folding-back case, the connecting portion for connecting the FPC to the external circuit must be projected to the outside of the liquid crystal panel by folding-back again the folded FPC, and on the other hand, according to the above-described embodiment, the second connecting portion 67 projects to the outside of the liquid crystal panel 3 without folding-back the FPC 5 again, so that the liquid crystal panel 3 and the external circuit 6 can be connected to each other without applying an excessively great stress to the FPC 5.

In addition, without using a separate substrate, the liquid crystal panel 3 and the external circuit 6 can be connected by the second connecting portion 67, so that the constitution can be simplified.

Further, in the conventional case where a connecting portion to be connected to the external circuit is provided on the longitudinal end of the FPC so as to avoid re-folding-back of the FPC, this connecting portion projects to the outside in the width direction of the liquid crystal panel, so that space saving is difficult, and on the other hand, according to the above-described embodiment, the projecting direction of the second connecting portion 67 is opposite to the connecting direction of the first connecting portion 65, so that the second connecting portion 67 does not project in the width direction of the liquid crystal panel 3, and space saving is realized.

By mounting the LEDs 56 on the liquid crystal panel 3 so that they oppose the entrance face 55*a* of the light guide plate 55 fixing the folded-back FPC 5, the LEDs 56 are sealed among the folded-back FPC 5, the liquid crystal panel 3 and light guide plate 55 and do not project to the outside, and it is not necessary to separately provide a substrate exclusive for power supply to the LEDs 56, so that space saving is realized.

By thus realizing space saving and reduction in thickness, the liquid crystal display device 1 can be used in small-sized and thin type equipment such as a mobile phone, and downsizing and reduction in thickness of this equipment such as a mobile phone are also possible.

In the above-described embodiment, the shape of the second connecting portion 67 is properly set corresponding to the positional relationship between the liquid crystal display device 1 and the external circuit 6 and the connecting form to the external circuit 6.

The display element is not limited to the transmission type liquid crystal panel 3, but maybe, for example, a reflection type liquid crystal panel or an organic EL.

What is claimed is:

1. A display device comprising:
    a display element having a first surface, a second surface, and a peripheral portion; and
    a flexible substrate for electrically connecting the display element and an external circuit, the flexible substrate comprising:
        a projecting portion coupled to the second surface of the display element, the projecting portion having a bending portion folded around the peripheral portion;
        a first connecting portion extending from the bending portion and electrically connected to the first surface of the display element; and
        a second connecting portion for connection to the external circuit, the second connecting portion extending from the projecting portion at the bending portion in a direction away from the display element.

2. The display device according to claim 1, further comprising:
    a light guide disposed on the second surface, wherein the projecting portion is coupled to the light guide, and wherein the flexible substrate includes a light source mounted on the projecting portion and coupled to a side surface of the light guide.

3. The display device according to claim 2, wherein the flexible substrate has a notch between the bending portion and the second connecting portion.

4. The display device according to claim 1, wherein the display element is a liquid crystal display element including an array substrate, a counter substrate opposing the array substrate, and a liquid crystal layer interposed between the array substrate and the counter substrate.

* * * * *